United States Patent
Villard

(10) Patent No.: US 8,258,682 B2
(45) Date of Patent: Sep. 4, 2012

(54) HIGH THERMAL CONDUCTIVITY PACKAGING FOR SOLID STATE LIGHT EMITTING APPARATUS AND ASSOCIATED ASSEMBLING METHODS

(75) Inventor: Russell George Villard, Apex, NC (US)

(73) Assignee: Cree, Inc., Durham, NC (US)

( * ) Notice: Subject to any disclaimer, the term of this patent is extended or adjusted under 35 U.S.C. 154(b) by 678 days.

(21) Appl. No.: 11/673,951

(22) Filed: Feb. 12, 2007

(65) Prior Publication Data
US 2008/0192493 A1 Aug. 14, 2008

(51) Int. Cl.
H01J 7/24 (2006.01)
(52) U.S. Cl. ............... 313/46; 362/249.01; 362/249.04; 362/612
(58) Field of Classification Search ............. 313/46; 362/555, 612, 249.01–249.04
See application file for complete search history.

(56) References Cited

U.S. PATENT DOCUMENTS

| | | |
|---|---|---|
| 1,565,500 A | 12/1925 | Ritter |
| 3,805,937 A | 4/1974 | Hatanaka et al. |
| 3,927,290 A | 12/1975 | Denley |
| 4,163,277 A | 7/1979 | Altman |
| 4,165,851 A | 8/1979 | Bowden, Jr. et al. |
| 4,219,871 A | 8/1980 | Larrimore |
| 4,325,146 A | 4/1982 | Lennington |
| 4,394,600 A * | 7/1983 | Flannagan ............. 313/500 |
| 4,408,157 A | 10/1983 | Beaubien |
| 4,420,398 A | 12/1983 | Castino |
| 4,441,142 A * | 4/1984 | Garofalo ............. 362/158 |
| 5,087,883 A | 2/1992 | Hoffman |
| 5,264,997 A | 11/1993 | Hutchisson et al. |
| 5,386,959 A | 2/1995 | Laughlin et al. |
| 5,407,799 A | 4/1995 | Studier |
| 5,410,519 A | 4/1995 | Hall et al. |
| 5,537,301 A | 7/1996 | Martich |
| 5,563,849 A | 10/1996 | Hall et al. |
| 5,588,737 A | 12/1996 | Kusmer |
| 5,632,551 A | 5/1997 | Roney et al. |
| 5,697,696 A | 12/1997 | Kuroda et al. |
| 5,725,302 A | 3/1998 | Sirkin |
| 5,820,253 A | 10/1998 | Scholz |
| 5,850,126 A | 12/1998 | Kanbar |
| 5,924,785 A | 7/1999 | Zhang et al. |
| 6,076,788 A | 6/2000 | Akiyama |

(Continued)

FOREIGN PATENT DOCUMENTS
DE 195 28 459 A1 2/1997

(Continued)

OTHER PUBLICATIONS

Cree, Inc., *Cree® XLamp® 7090 XR-E Series LED Binning and Labeling*, Application Note: CLD-AP08.000, 7 pp (2006).

(Continued)

*Primary Examiner* — Bumsuk Won
(74) *Attorney, Agent, or Firm* — Myers Bigel Sibley & Sajovec

(57) ABSTRACT

One or more solid state light emitting elements are mounted on a hardcoat anodized aluminum substrate. One or more bars also may be provided that slidably contact an edge of the hardcoat anodized aluminum substrate. The substrate and the bar(s) may be mounted in a housing with the bars mounted in apertures in the housing wall. Related assembling methods for solid state light emitting apparatus also are disclosed.

33 Claims, 7 Drawing Sheets

U.S. PATENT DOCUMENTS

| | | |
|---|---|---|
| D428,516 S | 7/2000 | Reo et al. |
| D430,339 S | 8/2000 | Reo |
| 6,095,666 A | 8/2000 | Salam |
| D437,446 S | 2/2001 | Reo et al. |
| D443,949 S | 6/2001 | DiMonte |
| 6,292,901 B1 | 9/2001 | Lys et al. |
| 6,335,538 B1 | 1/2002 | Prutchi et al. |
| 6,340,868 B1 | 1/2002 | Lys et al. |
| 6,348,766 B1 | 2/2002 | Ohishi et al. |
| 6,350,043 B1 | 2/2002 | Gloisten |
| 6,357,889 B1 | 3/2002 | Duggal et al. |
| 6,394,621 B1 | 5/2002 | Hanewinkel, III |
| 6,428,189 B1 | 8/2002 | Hochstein |
| 6,578,998 B2 | 6/2003 | Zhang |
| 6,592,810 B2 | 7/2003 | Nishida et al. |
| 6,624,350 B2 | 9/2003 | Nixon et al. |
| 6,787,999 B2 * | 9/2004 | Stimac et al. ............... 315/51 |
| 6,791,257 B1 | 9/2004 | Sato et al. |
| 6,851,834 B2 | 2/2005 | Leysath |
| 6,874,911 B2 | 4/2005 | Yoneda |
| 6,880,954 B2 | 4/2005 | Ollett et al. |
| 6,889,943 B2 | 5/2005 | Dinh et al. |
| 6,957,905 B1 * | 10/2005 | Pritchard et al. ............ 362/554 |
| 6,964,507 B2 | 11/2005 | Mohacsi |
| 6,995,355 B2 | 2/2006 | Rains, Jr. et al. |
| 7,001,047 B2 | 2/2006 | Holder et al. |
| 7,014,336 B1 | 3/2006 | Ducharme et al. |
| 7,093,958 B2 | 8/2006 | Coushaine |
| 7,131,760 B2 | 11/2006 | Mayer et al. |
| 7,144,135 B2 | 12/2006 | Martin et al. |
| 7,148,470 B2 | 12/2006 | Rains, Jr. et al. |
| 7,178,941 B2 | 2/2007 | Roberge et al. |
| 7,210,817 B2 | 5/2007 | Lee et al. |
| 7,213,940 B1 | 5/2007 | Van De Ven et al. |
| 7,232,212 B2 | 6/2007 | Iwase |
| 7,244,058 B2 | 7/2007 | DiPenti et al. |
| 7,246,921 B2 | 7/2007 | Jacobson et al. |
| 7,329,887 B2 | 2/2008 | Henson et al. |
| 7,344,296 B2 | 3/2008 | Matsui et al. |
| 7,365,991 B2 | 4/2008 | Aldrich et al. |
| 7,374,311 B2 | 5/2008 | Rains, Jr. et al. |
| D571,944 S | 6/2008 | Pickard et al. |
| 7,510,159 B2 | 3/2009 | Rippel |
| D592,347 S | 5/2009 | Trott et al. |
| D592,348 S | 5/2009 | Trott et al. |
| 7,554,129 B2 | 6/2009 | Roth et al. |
| D596,330 S | 7/2009 | Pickard et al. |
| 7,575,354 B2 | 8/2009 | Woodward |
| 2002/0087532 A1 | 7/2002 | Barritz et al. |
| 2003/0147254 A1 * | 8/2003 | Yoneda et al. ................ 362/551 |
| 2004/0095777 A1 * | 5/2004 | Trenchard et al. ............ 362/477 |
| 2004/0156213 A1 * | 8/2004 | Lodhie ........................ 362/555 |
| 2005/0051789 A1 | 3/2005 | Negley et al. |
| 2005/0117332 A1 | 6/2005 | Maack |
| 2005/0162864 A1 * | 7/2005 | Verdes et al. ................ 362/555 |
| 2005/0168986 A1 | 8/2005 | Wegner |
| 2005/0213331 A1 * | 9/2005 | Lewis ........................... 362/294 |
| 2005/0247842 A1 | 11/2005 | Wronski |
| 2005/0254241 A1 * | 11/2005 | Harwood ..................... 362/231 |
| 2006/0262545 A1 * | 11/2006 | Piepgras et al. .............. 362/373 |
| 2007/0064428 A1 * | 3/2007 | Beauchamp .................. 362/294 |
| 2007/0097681 A1 * | 5/2007 | Chich et al. .................. 362/232 |
| 2007/0137074 A1 | 6/2007 | Van De Ven et al. |
| 2007/0139920 A1 | 6/2007 | Van De Ven et al. |
| 2007/0139923 A1 | 6/2007 | Negley et al. |
| 2007/0170447 A1 | 7/2007 | Negley et al. |
| 2007/0171145 A1 | 7/2007 | Coleman et al. |
| 2007/0223219 A1 | 9/2007 | Medendorp et al. |
| 2007/0236911 A1 | 10/2007 | Negley |
| 2007/0247414 A1 | 10/2007 | Roberts |
| 2007/0247847 A1 * | 10/2007 | Villard ........................ 362/249 |
| 2007/0247851 A1 | 10/2007 | Villard |
| 2007/0262337 A1 | 11/2007 | Villard |
| 2007/0263393 A1 | 11/2007 | Van De Ven |
| 2007/0267983 A1 | 11/2007 | Van De Ven et al. |
| 2007/0274063 A1 | 11/2007 | Negley |
| 2007/0274080 A1 | 11/2007 | Negley et al. |
| 2007/0278503 A1 | 12/2007 | Van De Ven et al. |
| 2007/0278934 A1 | 12/2007 | Van De Ven et al. |
| 2007/0279440 A1 | 12/2007 | Negley |
| 2007/0279903 A1 | 12/2007 | Negley et al. |
| 2007/0280624 A1 | 12/2007 | Negley et al. |
| 2008/0049444 A1 * | 2/2008 | Hsiao et al. .................. 362/611 |
| 2008/0084685 A1 | 4/2008 | Van De Ven et al. |
| 2008/0084700 A1 | 4/2008 | Van De Ven |
| 2008/0084701 A1 | 4/2008 | Van De Ven et al. |
| 2008/0088248 A1 | 4/2008 | Myers |
| 2008/0089053 A1 | 4/2008 | Negley |
| 2008/0089069 A1 | 4/2008 | Medendorp |
| 2008/0103714 A1 | 5/2008 | Aldrich et al. |
| 2008/0106895 A1 | 5/2008 | Van De Ven et al. |
| 2008/0106907 A1 | 5/2008 | Trott et al. |
| 2008/0112168 A1 | 5/2008 | Pickard et al. |
| 2008/0112170 A1 | 5/2008 | Trott et al. |
| 2008/0112183 A1 | 5/2008 | Negley |
| 2008/0130285 A1 | 6/2008 | Negley et al. |
| 2008/0136313 A1 | 6/2008 | Van De Ven et al. |
| 2008/0137347 A1 | 6/2008 | Trott et al. |
| 2008/0170396 A1 | 7/2008 | Yuan et al. |
| 2008/0192493 A1 | 8/2008 | Villard |
| 2008/0224157 A1 | 9/2008 | Slater |
| 2008/0231201 A1 | 9/2008 | Higley et al. |
| 2008/0259589 A1 | 10/2008 | Van De Ven |
| 2008/0278940 A1 | 11/2008 | Van De Ven et al. |
| 2008/0278950 A1 | 11/2008 | Pickard et al. |
| 2008/0278952 A1 | 11/2008 | Trott et al. |
| 2008/0278957 A1 | 11/2008 | Pickard et al. |
| 2008/0304260 A1 | 12/2008 | Van de Ven et al. |
| 2008/0304261 A1 | 12/2008 | Van De Ven et al. |
| 2008/0310154 A1 | 12/2008 | Van de Ven et al. |
| 2009/0002986 A1 | 1/2009 | Medendorp et al. |
| 2009/0021841 A1 | 1/2009 | Negley et al. |
| 2009/0108269 A1 | 4/2009 | Negley et al. |
| 2009/0161356 A1 | 6/2009 | Negley et al. |

FOREIGN PATENT DOCUMENTS

| | | |
|---|---|---|
| DE | 299 21 156 U1 | 5/2000 |
| DE | 203 15 543 U1 | 2/2004 |
| DE | 20 2004 003 793 U1 | 5/2004 |
| DE | 10 2004 001 940 A1 | 8/2005 |
| EP | 1 081 771 A2 | 3/2001 |
| EP | 1 111 966 A2 | 6/2001 |
| EP | 1 139 019 A1 | 10/2001 |
| EP | 1 139 439 A1 | 10/2001 |
| EP | 1 174 307 A2 | 1/2002 |
| EP | 1 512 902 A2 | 3/2005 |
| EP | 1 586 814 A2 | 10/2005 |
| EP | 1 600 691 A1 | 11/2005 |
| EP | 1 674 792 A2 | 6/2006 |
| EP | 1 895 227 A1 | 3/2008 |
| FR | 2 263 458 | 10/1975 |
| GB | 1 494 493 | 12/1977 |
| WO | WO 98/43014 | 10/1998 |
| WO | WO 00/34709 | 6/2000 |
| WO | WO 2004/071143 A1 | 8/2004 |
| WO | WO 2006/033998 A1 | 3/2006 |
| WO | WO 2006/127785 A2 | 11/2006 |
| WO | WO 2006/128327 A1 | 12/2006 |

OTHER PUBLICATIONS

Cree, Inc., *Cree® XLamp® 7090 XR-E Series LED Data Sheet*, Datasheet: CLD-DS05.000, 10 pp (2006).
Cree, Inc., *Cree® XLamp® 7090 XR-E Series LED Secondary Optics*, Datasheet: CLD-DS07.000, 3 pp (2004-2006).
McMaster-Carr Supply Company, *Multipurpose Aluminum (Alloy 6061), specification sheets*, Retrieved Dec. 14, 2006 from www.mcmaster.com/param/asp/Psearch2.asp?reqTyp=parametric&act=psearch%F . . . , 3 pp.
U.S. Appl. No. 12/146,018, Jun. 25, 2008, Roberts et al.
U.S. Appl. No. 29/279,583, May 3, 2007, Trott et al.
U.S. Appl. No. 29/279,586, May 3, 2007, Trott.
U.S. Appl. No. 29/298,299, Dec. 3, 2007, Trott et al.
U.S. Appl. No. 29/324,486, Sep. 12, 2008, Trott.
U.S. Appl. No. 60/990,435, Nov. 27, 2007, Van de Ven et al.
International Search Report and the Written Opinion for PCT/US2008/062825, mailed Jul. 16, 2008 (12 pages).

International Search Report and Written Opinion for PCT/US07/10766, mailed Sep. 24, 2008 (9 pages).
International Search Report and Written Opinion for PCT/US07/078633, mailed Feb. 29, 2008 (13 pages).
International Search Report and Written Opinion for PCT/US07/079123, mailed May 19, 2008 (17 pages).
International Search Report and Written Opinion for PCT/US07/084513, mailed Mar. 13, 2008 (14 pages).
International Search Report and Written Opinion for PCT/US07/084519, mailed Apr. 1, 2008 (14 pages).
International Search Report and Written Opinion for PCT/US08/062610, mailed Oct. 31, 2008 (15 pages).
International Search Report and Written Opinion of International Application No. PCT/US06/48521, mailed Feb. 7, 2008 (12 pages).
International Search Report and Written Opinion of International Application No. PCT/US2008/062826, mailed Jul. 16, 2008 (15 pages).
Focal Point Web Material, "Focal Point® Launches Two Dimensions of Popular Sky™ Family" 1 pages, 2002.
Focal Point Web Material, "Sky™ 2×2", 1 page, 2002.
Focal Point Literature, "Sky™ 2×2", pp. 116-117, 3 pages, Aug. 2005.
Focal Point Literature, "Sky™ 4×4", pp. 118-119, 3 pages, Aug. 2005.
Narendran et al. "Solid-State Lighting: Failure Analysis of White LEDs" *Journal of Crystal Growth* 268(2-3):Abstract (2 pages) (Jun. 2004).
Supplementary European Search Report for European Application No. 06845870.2, dated Nov. 6, 2008 (8 pages).

* cited by examiner

HIGH THERMAL CONDUCTIVITY PACKAGING FOR SOLID STATE LIGHT EMITTING APPARATUS AND ASSOCIATED ASSEMBLING METHODS

FIELD OF THE INVENTION

This invention relates to solid state light emitting apparatus, and more particularly to packaging techniques and methods for solid state light emitting apparatus.

BACKGROUND OF THE INVENTION

Solid state light emitting apparatus are being widely designed and marketed as replacements for conventional incandescent lighting apparatus and/or other conventional lighting applications. Solid state light emitting apparatus can include solid state flashlights, spotlights, searchlights, headlights, pixels for arena displays, recessed lighting, light fixtures and/or other solid state lighting devices. Such solid state light emitting apparatus generally include a mounting substrate and a plurality of solid state light emitting elements, such as Light Emitting Diodes (LEDs), on the mounting substrate. A housing is configured for mounting the substrate therein. Optical elements, such as lenses, solid state light emitting element drivers and/or other support circuitry and/or a power source, such as a battery power supply and/or connections for an alternating current (AC)/direct current (DC) power supply, also may be provided. The solid state light emitting elements themselves may provide the appearance of white light, colored light and/or any other narrow or wideband light spectrum.

Although solid state light emitting elements, such as LEDs, may be more efficient that conventional incandescent light bulbs, the LEDs may still generate substantial heat under operating conditions, which may degrade device performance and/or reliability. Accordingly, when multiple LEDs are placed on a mounting substrate to provide a light emitting apparatus, thermal management techniques may be desired to dissipate heat and to maintain LED performance/reliability. Conventional techniques for thermal management may include mounting LEDs on thermally conductive media and/or the use of heat sinks. However, these techniques may not be as effective when used in at least partially enclosed housings.

SUMMARY OF THE INVENTION

Light emitting apparatus according to various embodiments of the present invention include a hardcoat anodized aluminum substrate and a plurality of solid state light emitting elements mounted on the hardcoat anodized aluminum substrate. In some embodiments, the hardcoat anodized aluminum substrate is planar and the plurality of solid state light emitting elements are mounted on a face of the planar hardcoat anodized substrate. High thermal conductivity packaging for solid state light emitting elements may thereby be provided.

Other embodiments of the invention provide a bar that extends orthogonal to the planar hardcoat anodized aluminum substrate and is configured to slidably contact an edge of the planar hardcoat anodized aluminum substrate, such that the planar hardcoat anodized aluminum substrate is slidable along the bar. A housing may also be provided that includes an elongated aperture therein that is configured to hold the bar therein, such that the bar extends from inside the housing to outside the housing. In some embodiments, the bar also is also a hardcoat anodized aluminum bar. Moreover, in some embodiments, the substrate includes a tab adjacent the edge thereof that is configured to slidably contact the bar. A locking element, such as a setscrew that extends through the tab, may be configured to lock the tab in place along the bar. Moreover, in other embodiments, the housing includes an elongated aperture therein that is configured to hold the bar therein, such that the bar extends along the housing away from the hardcoat anodized aluminum substrate. In some embodiments, the bar also is a hardcoat anodized aluminum bar.

Moreover, in any of the above-described embodiments, a second substrate may be provided between at least one of the plurality of solid state light emitting elements and the hardcoat anodized aluminum substrate. In some embodiments, the second substrate may include a metal core printed circuit board. Other packaging elements, such as an optically transparent cover, may be provided that extends across an opening of the housing. Moreover, in other embodiments, a housing that comprises hardcoat anodized aluminum may be provided that is configured to hold the hardcoat anodized aluminum substrate therein. Thus, in these embodiments, the hardcoat anodized aluminum housing need not include bars therein.

Light emitting apparatus according to other embodiments of the present invention include a disk-shaped substrate and a plurality of solid state light emitting elements on a face of the disk-shaped substrate. A cylindrical housing also is provided including a plurality of axially extending elongated apertures therein. A plurality of heat conducting bars are also provided, a respective one of which is in a respective aperture, such that the heat conducting bars extend from inside the cylindrical housing to outside the cylindrical housing. The disk-shaped substrate is mounted coaxially in the cylindrical housing, such that an edge of the disk-shaped substrate is adjacent the plurality of heat conducting bars to dissipate heat from the solid state light emitting elements, through the disk-shaped substrate and through the heat conducting bars to outside the housing.

In some embodiments, the disk-shaped substrate and the plurality of heat conducting bars are of higher thermal conductivity than the cylindrical housing. Specifically, in some embodiments, the heat conducting bars and the disk-shaped substrate may comprise hardcoat anodized aluminum. In other embodiments, the heat conducting bars are configured to slidably contact the edge of the disk-shaped substrate. Specifically, the disk-shaped substrate may include a plurality of tabs adjacent the edge thereof, a respective tab being configured to slidably contact a respective heat conducting bar. A plurality of locking elements, such as a plurality of setscrews that extend through a respective tab, also may be provided to lock a respective tab in place along a respective heat conducting bar. Moreover, a second substrate, such as a metal core printed circuit board may also be provided may also be provided between at least one of the solid state light emitting elements and the disk-shaped substrate. An optically transparent cover also may be provided that extends across an end of the cylindrical housing that is adjacent the solid state light emitting elements.

Other embodiments of the invention provide methods of assembling a light emitting apparatus that comprise mounting a disk-shaped substrate having a plurality of solid state light emitting elements on a face thereof coaxially in a cylindrical housing that includes a plurality of axially extending elongated apertures therein and a plurality of heat conducting bars, a respective one of which is in a respective aperture, such that the heat conducting bars extend from inside the housing to outside the housing, and an edge of the disk-shaped substrate is adjacent the plurality of heat conducting bars to dissipate heat from the solid state light emitting elements through the disk-shaped substrate and through the heat conducting bars to outside the housing. In some embodiments, the disk-shaped substrate is slidably mounted in the cylindrical housing. Moreover, in some embodiments, after slidably mounting the disk-shaped substrate in the cylindrical housing, the position of the disk-shaped substrate in the cylindrical housing is slidably adjusted to a desired position and then fixed at the desired position.

DETAILED DESCRIPTION

Figure 1:
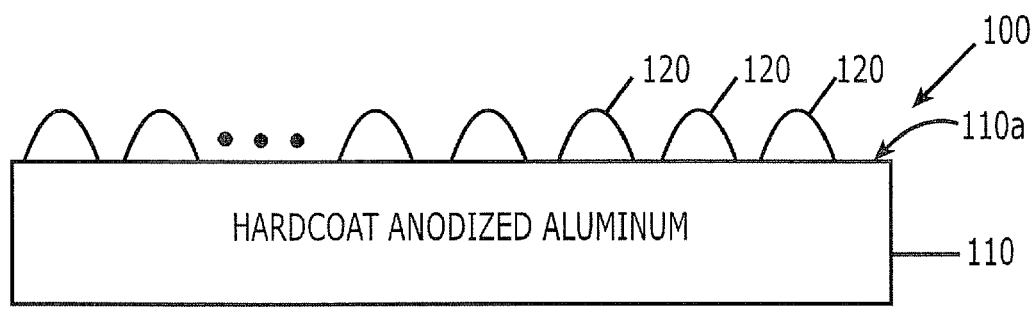
FIGS. 1-7 are cross-sectional views of light emitting apparatus according to various embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "included," "including," "have" and/or "having" when used in this specification, specify the presence of stated features, regions, steps, operations, elements, and/or components, but do not preclude the presence or addition of one or more other features, regions, steps, operations, elements, components, and/or groups thereof.

It will be understood that when an element, such as a layer or region, is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section.

Furthermore, relative terms, such as "lower", "base", or "horizontal", and "upper", "top", or "vertical" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section and perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Some embodiments of the present invention use hardcoat anodized aluminum in light emitting apparatus. As is well known to those having skill in the art, anodizing is a technique used to modify the surface of a metal. Anodizing can provide greater corrosion resistance, create a different surface topography and change the crystal structure close to the metal surface. The anodizing process derives its name from the fact that the part to be treated forms the anode portion of an electrical circuit in this electrolytic process. Anodization is frequently used to protect aluminum from abrasion and corrosion and to allow it be dyed in a wide array of colors. Anodized aluminum can be found in many consumer products such as iPods, cookware, cameras, sporting goods and many other products, due to its aesthetic and corrosion protection properties. Moreover, aluminum aircraft parts, including major components, may be anodized before assembly and painting. Anodized aluminum is also a popular choice of material for flashlights. The aluminum oxide anodized coating is grown from and into the surface of the aluminum. Because of this, it is not prone to peeling or cracking like organic coatings, such as paint. Aluminum oxide also possesses excellent thermal conductivity and dissipating (spreading) qualities.

As is also known to those having skill in the art, hardcoat anodizing is an electrochemical process that yields an anodic oxide, integral to the aluminum part. The layer increases the resistance of corrosion, wear and friction. For example, the cylinders of the BMW modern aluminum V8 have hardcoated walls. Hardcoat anodizing also increases the thermal dissipating properties of a material. Like other forms of anodizing (such as a Type I chromic acid anodizing or Type II sulphuric acid anodizing), hardcoat anodizing (also known as Type III) is produced by immersing the aluminum component into an electrolyte solution. However, hardcoat anodizing may be up to 20 times thicker (0.008") compared to Type I or Type II anodized aluminum. The hardcoat layer can have a hardness equivalent to that of ruby ($Al_2O_3$), one of the hardest materials on earth and, in industrial terms, may have a hardness of 60 to 65 Rockwell on the C scale.

FIG. 1 is a cross-sectional view of light emitting apparatus 100 according to some embodiments of the present invention. As shown in FIG. 1, a hardcoat anodized aluminum substrate 110 is provided, and a plurality of solid state light emitting elements 120 are mounted on a face 110a of the hardcoat anodized aluminum substrate 110. The light emitting elements may provide a light of a given color, may provide the appearance of white light and/or may be tailored for any other desired lighting applications. The plurality of solid state light emitting elements 120 need not be identical. Moreover, the solid state light emitting elements 120 may comprise packaged light emitting diodes (LEDs), such as XLamp 7090 XR-E Series LEDs marketed by Cree, Inc., the assignee of the present application, and described at cree.com/xlamp. It will be understood that many configurations and arrangements of the hardcoat anodized aluminum substrate 110 and of the solid state light emitting elements 120 may be provided according to various embodiments of the present invention, based on the particular application of a given design.

As illustrated in FIG. 1, the hardcoat anodized aluminum substrate 110 is planar in some embodiments. However, in other embodiments, nonplanar substrates may be used and, in still other embodiments, the solid state light emitting elements 120 may be mounted on different faces of the hardcoat anodized aluminum substrate 110.

Figure 2:
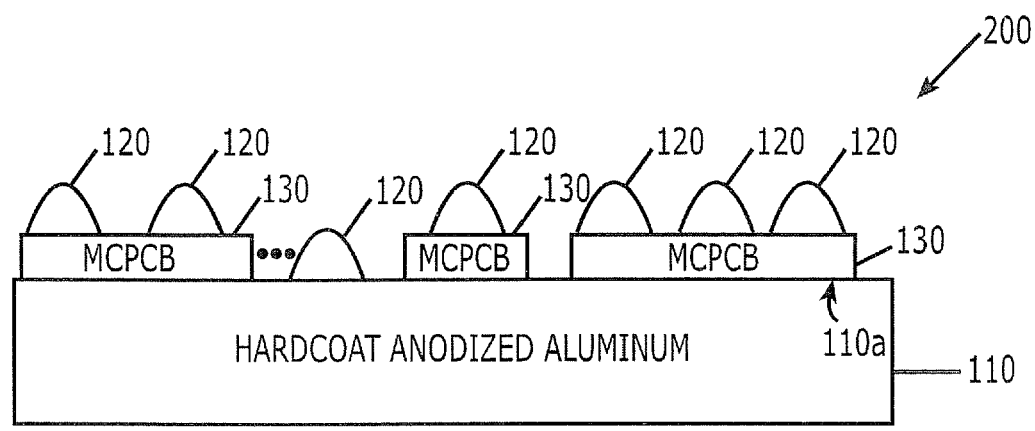

In FIG. 1, the solid state light emitting elements 120 are mounted directly on a face 110a of the hardcoat anodized aluminum substrate 110. However, in embodiments of FIG. 2, a second substrate 130 may be provided between at least one of the plurality of solid state light emitting elements 120 and the hardcoat anodized aluminum substrate 110. In some embodiments, the second substrate(s) comprise metal core printed circuit boards (MCPCB). As shown in FIG. 2, a metal core printed circuit board 130 may be provided for a single light emitting device or multiple light emitting devices 120, and one or more light emitting devices 120 need not employ an intermediate metal core printed circuit board. As used herein, the term "metal core printed circuit board" is used generally for a heat conductive mounting substrate on which electronic components are mounted and wired. For example, a solid metal block mounting substrate is described in U.S. Patent Publication No. US 2005/0051789 to Negley et al., "Solid Metal Block Mounting Substrates For Semiconductor Light Emitting Devices", published Mar. 10, 2005, assigned to the assignee of the present invention, the disclosure of which is hereby incorporated herein by reference in its entirety as if set forth fully herein. Other embodiments of metal core printed circuit boards are widely available commercially and need not be described further herein.

Figure 3:
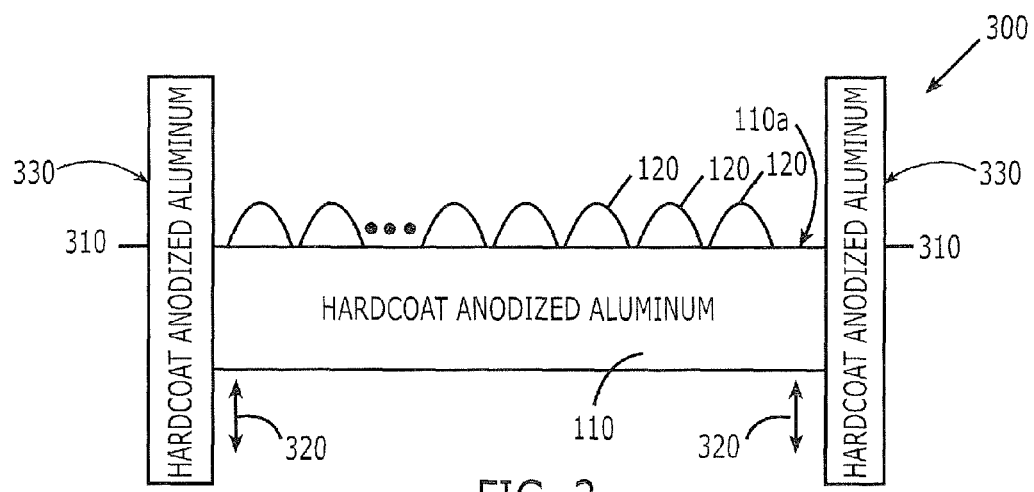
Figure 4:
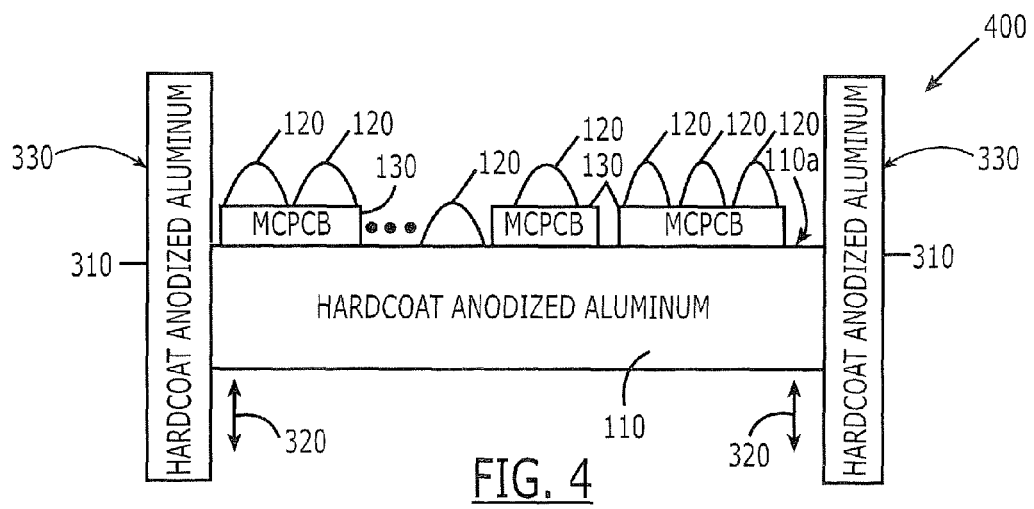

FIGS. 3 and 4 are cross-sectional views of other embodiments of the present invention. Light emitting apparatus 300 and 400 of FIGS. 3 and 4 are similar to the respective light emitting apparatus 100 and 200 of FIGS. 1 and 2, except that one or more bars 310 are added that extend orthogonal to the planar hardcoat anodized aluminum substrate 110. The bar(s) 310 may be configured to slidably contact an edge of the planar hardcoat anodized aluminum substrate 110, such that the planar hardcoat anodized aluminum substrate is slidable along the bars, as shown by arrows 320. In some embodiments, the bars 310 are also fabricated of hardcoat anodized aluminum to facilitate heat conduction away from the solid state light emitting elements 120.

FIGS. 3 and 4 may also be regarded as illustrating cross-sectional views of still other embodiments of the present invention, wherein a housing 330 comprising hardcoat anodized aluminum is provided. The housing 330 may be configured to slidably contact an edge of the planar hardcoat anodized aluminum substrate 110, such that the planar hardcoat anodized aluminum substrate 110 is slidable along the housing 330, as shown by arrows 320. In some embodiments, the housing 330 may be fabricated, at least in part, of hardcoat anodized aluminum, to facilitate heat conduction away from the solid state light emitting elements 120. Bars may not be needed.

Figure 5:
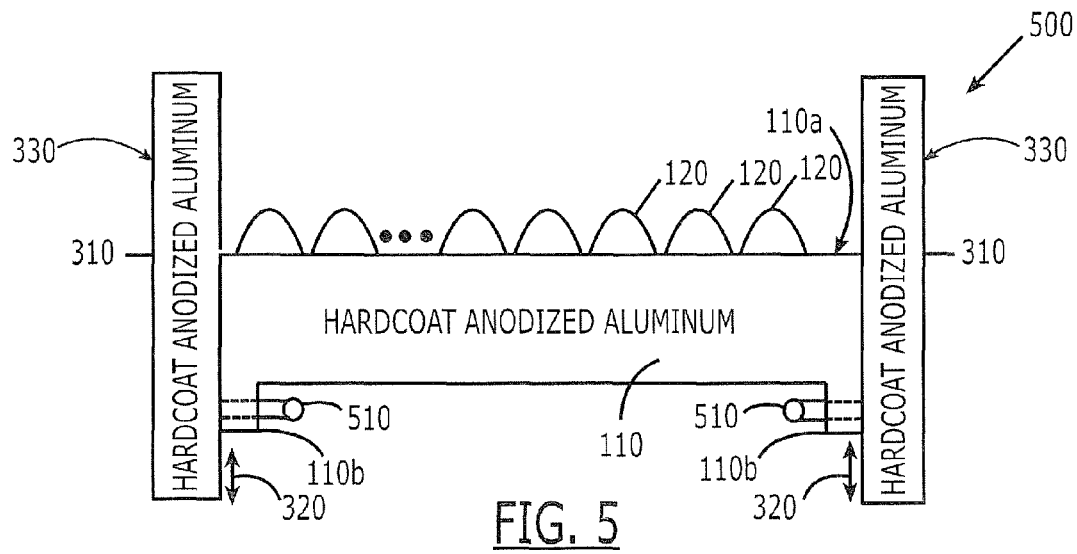
Figure 6:
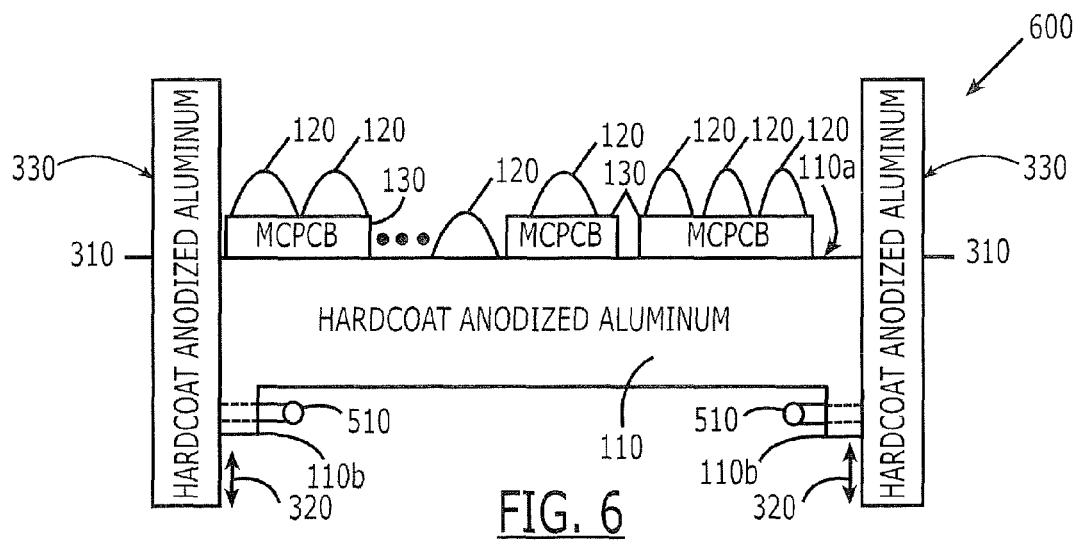

FIGS. 5 and 6 are cross-sectional views of light emitting apparatus 500 and 600, respectively, according to other embodiments of the present invention. FIGS. 5 and 6 are similar to FIGS. 3 and 4, respectively, except that the hardcoat anodized aluminum substrate 110 includes a tab 110b adjacent the edge thereof that is configured to slidably contact an adjacent bar 310. A locking element is also provided to lock the tab 110b in place along the bar 310. In some embodiments, as shown in FIGS. 5 and 6, the locking element comprises a setscrew 510 that extends through the tab 110b. However, many other locking element designs may be provided using mechanical design techniques well known to those having skill in the art. In some embodiments, the tab(s) 110b extend orthogonal to the substrate 110, but in other embodiments they need not do so. Moreover, FIGS. 5 and 6 may also be regarded as illustrating other embodiments of the invention, wherein the housing 330 itself is fabricated of hardcoat anodized aluminum, and discrete bars need not be provided.

Figure 7:
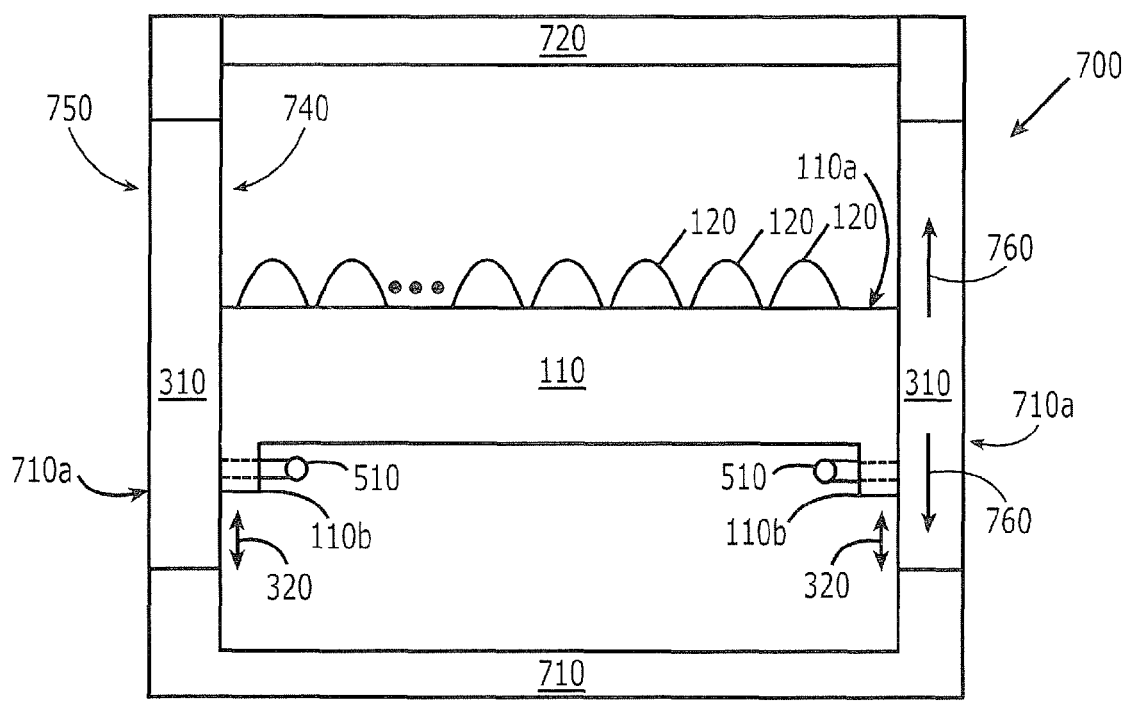
Figure 8:
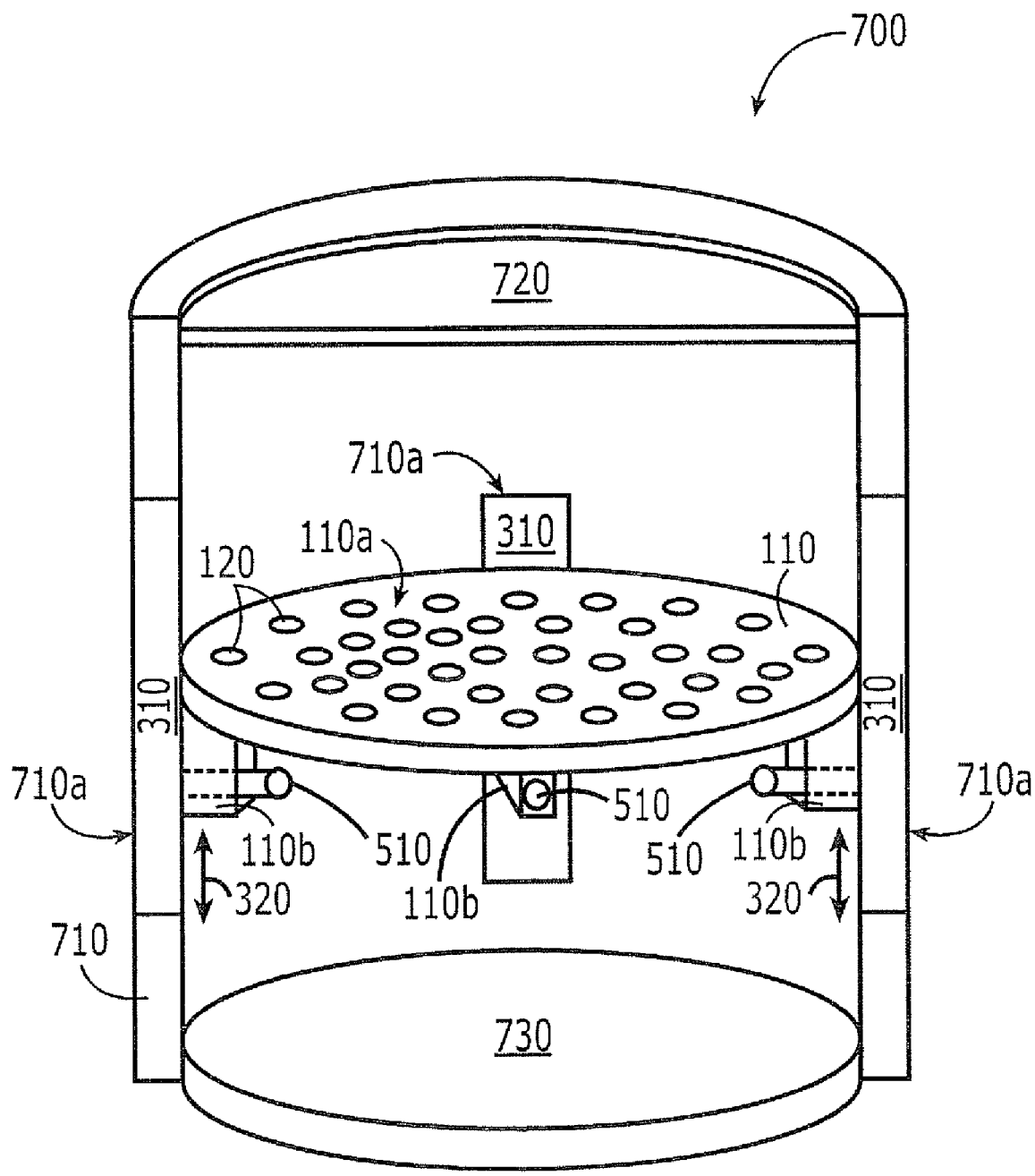
FIG. 8 is a perspective view of light emitting apparatus of FIG. 7.

FIG. 7 is a side cross-sectional view and FIG. 8 is a partially cutaway perspective view of light emitting apparatus 700 according to other embodiments of the present invention. As shown in FIGS. 7 and 8, these light emitting apparatus 700 include a disk-shaped substrate 110 and a plurality of solid state light emitting elements 120 on a face 110a of the disk-shaped substrate 110. A substrate as illustrated in FIGS. 1, 3 and 5 is shown in FIGS. 7 and 8. However, substrates illustrated in FIG. 2, 4 or 6, or other substrates and light emitting elements may also be used in other embodiments of the present invention.

Continuing with the description of FIGS. 7 and 8, a cylindrical housing 710 is provided, including a plurality of axially extending elongated apertures 710a therein. The housing 710 has an inside 740 and an outside 750. In FIGS. 7 and 8, four symmetrically placed apertures 710a are provided, wherein two apertures 710a are shown in FIG. 7 and three of the four apertures are illustrated in FIG. 8 (the frontmost aperture is not shown due to the cutaway). A plurality of heat conducting bars 310 also are provided, a respective one of which is in a respective aperture 710a, such that the heat conducting bars 310 extend from the inside 740 of the cylindrical housing 710 to the outside 750 of the cylindrical housing 710. The heat conducting bars 310 may be flush with the cylindrical housing 710, as illustrated in FIGS. 7 and 8, may protrude beyond the inner and/or outer surfaces of the housing 710 and/or may be recessed within the inner and/or outer surfaces of the housing 710 in other embodiments. FIGS. 7 and 8 may also be regarded as illustrating other embodiments of the present invention, wherein the heat conducting bars 310 extend along the housing 710 away from the hardcoat anodized aluminum substrate 110, as shown by arrows 760.

As also illustrated in FIGS. 7 and 8, the disk-shaped substrate 110 is mounted coaxially in the cylindrical housing 710, such than an edge of the disk-shaped substrate 110 is adjacent the plurality of heat conducting bars 310, to dissipate heat from the solid state light emitting elements 120, through the disk-shaped substrate 110, and through the heat conducting bars 310 to the outside 750 of the housing 710.

In some embodiments, the disk-shaped substrate 110 and the plurality of heat conducting bars 310 are of higher thermal conductivity than the cylindrical housing 710. For example, in some embodiments, the cylindrical housing 710 may be fabricated of steel, whereas the disk-shaped substrate 110 and the plurality of heat conducting bars 310 may comprise hardcoat anodized aluminum. It will be understood that the number, size and/or location of the apertures 710a and bars 310 may vary from that shown to suit a particular application.

As also shown in FIG. 8, the heat conducting bars 310 may be configured to slidably contact an edge of the disk-shaped substrate, so as to allow the substrate 110 to move axially along directions shown by arrows 320. Moreover, in some embodiments, the disk-shaped substrate 110 includes a plurality of tabs 110b adjacent an edge thereof, a respective tab 110b being configured to slidably contact a respective heat conducting bar 310. A plurality of locking elements, such as a plurality of setscrews 510 may also be provided, a respective one of which is configured to lock a respective tab 110b in place along the respective heat conducting bar 310. A respective heat conducting bar 310 also may include a respective groove therein to facilitate alignment of the setscrews 510 into the heat conducting bars 310. An optically transparent cover 720 may also be provided that extends across an end of the cylindrical housing 710 that is adjacent the solid state light emitting elements 120. It will be understood by those having skill in the art that, as used herein, "transparent" means that at least some of the light emitted from the light emitting elements 120 passes through the transparent cover 720 to emerge outside the housing 710. The transparent cover may include a lens, phosphor, dispersive element(s), color filter(s) and/or other optical elements well known to those having skill in the art. Moreover, the housing 710 may include a fixed or removable bottom 730.

In other embodiments, the housing and substrate may take on other shapes, such as ellipsoidal, polygonal and/or more complex shapes. Moreover, other conventional components may also be included in the housing, such as batteries, external wiring, controllers and/or other components well known to those having skill in the art.

Figure 9:
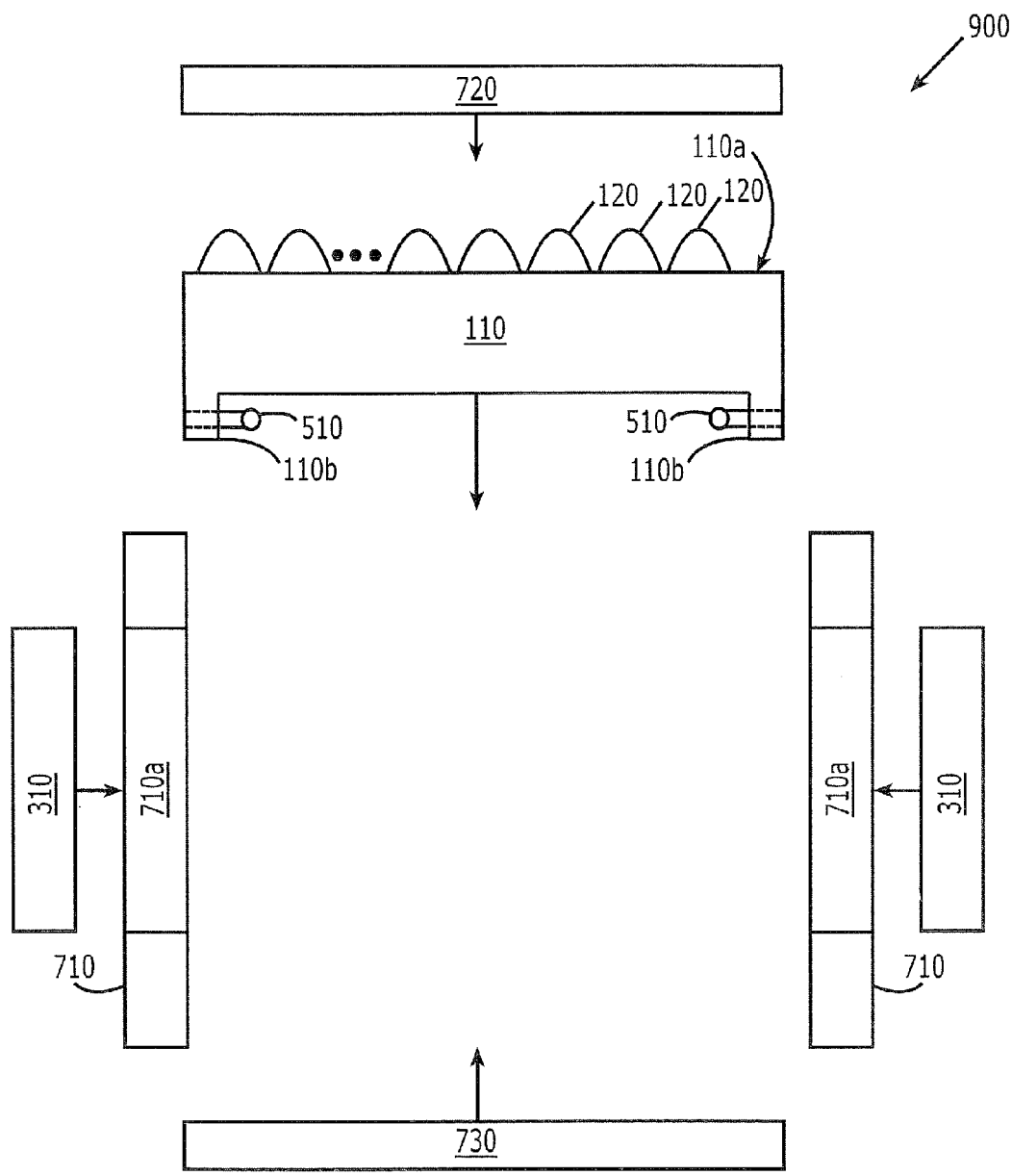
FIG. 9 is an exploded view of light emitting apparatus of FIG. 7.
Figure 10:
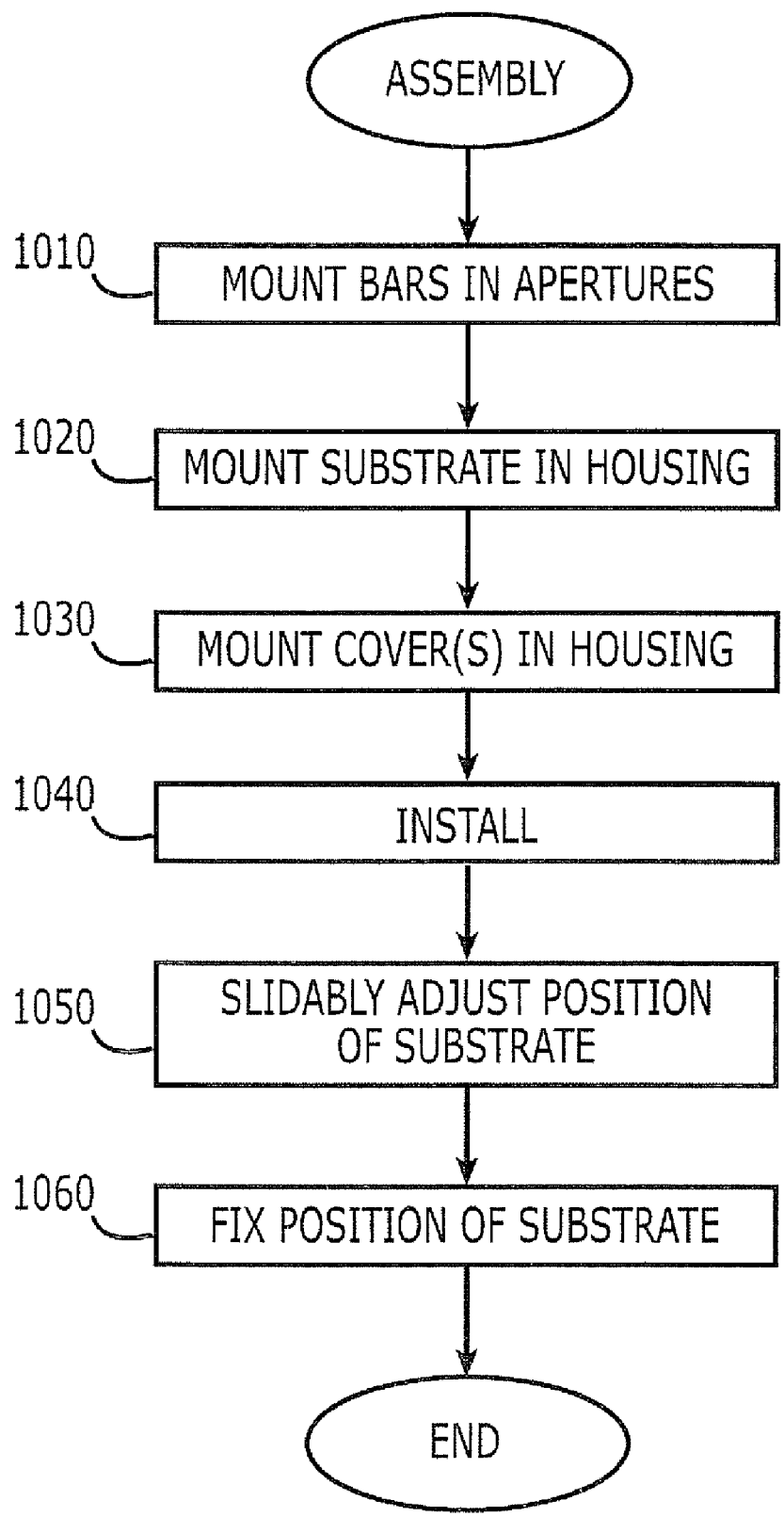
FIG. 10 is a flowchart of operations that may be performed to assemble light emitting apparatus according to various embodiments of the invention.

FIG. 9 is an exploded cross-sectional view of a light emitting apparatus 900 according to other embodiments of the present invention and FIG. 10 is a flowchart of operations that may be used to assemble a light emitting apparatus, such as the light emitting apparatus of FIG. 9, according to various embodiments of the invention. It will be understood that in some embodiments, the acts noted in the flowcharts may occur out of the order noted in the flowcharts. For example, two blocks shown in succession may in fact be executed substantially concurrently or the blocks may sometimes be executed in the reverse order, depending upon the acts involved. Moreover, the functionality of one or more blocks may be separated and/or combined with that of other blocks.

Referring now to FIGS. 9 and 10, at Block 1010, in order to assemble a light emitting apparatus according to some embodiments of the present invention, the elongated bars 310 may be mounted into the apertures 710a in housing 710, and may be maintained in place by press fit, adhesive and/or other conventional techniques. As shown at Block 1020, a disk-shaped substrate 110 including a plurality of solid state light emitting elements 120 on a face 110a thereof, is mounted coaxially in the cylindrical housing 710, such that an edge of the disk-shaped substrate 110 is adjacent the plurality of heat conducting bars 310. A bottom cover 730 and/or a transparent cover 720 are then mounted at respective ends of the housing, as shown at Block 1030. The light emitting apparatus 900 may then be installed, for example in a ceiling for a recessed light application, at Block 1040.

At Block 1050, prior to or after installing the light emitting apparatus 900, the position of the substrate may be slidably adjusted to a desired position by sliding the substrate 110 up or down within the housing 710. One or both of the covers may be removed prior to performing the adjustment. The position may be adjusted to obtain a desired angle and/or intensity of illumination and/or for other reasons known to those having skill in the art. Finally, at Block 1060, the position of the substrate in the housing 710 is fixed, for example by tightening the setscrews 510.

Embodiments of the present invention that were described in connection with FIGS. 5-9 employed one or more tab(s) 110b that may extend orthogonal to the substrate 110. In some embodiments, the orthogonal tab(s) 110b may be integral with the substrate 110 and may be formed, for example, by folding a protruding tab on the substrate 110 upward or downward (i.e., orthogonal to the face of the substrate 110). In other embodiments, the tab(s) may protrude parallel to the substrate 110 and contact the bar(s) 310. In still other embodiments, the tabs 110b need not be integral with the substrate 110 but, rather, may be formed using separate pieces of material, such as bars of hardcoat anodized aluminum that are attached to the substrate 110, orthogonal or parallel thereto. These separate tabs may themselves be slidably attached to the substrate to provide an added degree of adjustment.

Additional discussion of various embodiments of the present invention will now be provided.

In particular, as is known to those having skill in the art, solid state light emitting elements, such as LEDs, generate heat under operating conditions, which may degrade device performance. When LEDs are placed together for general lighting applications, thermal management techniques may be needed to dissipate heat and maintain LED performance. Conventional techniques for thermal management may include mounting the LEDs on thermally conductive media and the use of heat sinks. Embodiments of the present invention can allow heat to be dissipated efficiently, which can allow for a small package size and/or high device integration.

Some embodiments of the invention include one or more packaged LEDs, such as an XLamp 7090 XR-E series, on a metal core printed circuit board that is mounted directly to a mounting substrate of hardcoat anodized aluminum. Hardcoat anodized aluminum is strong and durable, lightweight and electrically insulating, while providing high thermal conductivity and spreading (dissipation). In some embodiments, no additional heat dissipating components may be needed. In some embodiments, the mounting substrate may be a thin (⅛") sheet of hardcoat anodized aluminum. The sheet may be any shape depending on the application, such as square, rectangle, circle, etc. The fixture (apparatus) may include multiple sheets. In other embodiments, the mount or substrate may have a cell structure, for example a honeycomb structure, of hardcoat anodized aluminum. This may provide even greater heat management for higher power applications and/or applications with higher density LEDs. Embodiments of the present invention may be used in any LED light fixture, such as streetlights, can lights, high bay lighting, light bars, etc.

Other embodiments of the present invention can provide canned LED lighting fixtures that can have improved thermal performance and an adjustable mounting position for the LEDs. An example fixture may include a canned light fixture housing, the circular platform or substrate located within the housing, one or more LEDs mounted on the circular platform, and a mechanism for raising or lowering the position of the circular platform within the housing. In some embodiments, as was described above, the mechanism for raising/lowering includes four support bars that are embedded in the walls of the housing, for example using thermal glue. The circular platform may be secured to the bars at any vertical position using pins, clamps, hinges, setscrews and/or other conventional elements. This vertical position is typically adjusted and set when the fixture is first installed according to LED brightness and/or other factors such as fixture optics and/or diffusers. The circular platform and the structural bars may be made of any material that has good thermal conductivity, for example aluminum, hardcoat anodized aluminum and/or copper. The adjustable circular platform is in thermal contact with the structural bars, and helps spread heat away from the LEDs. Hardcoat anodized aluminum is a good material choice because it is strong and durable, lightweight and electrically insulating while providing high thermal conductivity.

In some specific embodiments, a thermal solution may be provided to allow use of LEDs in recessed shower lights. Conventional recessed shower lights are not designed to handle the heat associated with LED light sources. However, embodiments of the present invention can provide a thermal solution while maintaining a waterproof and/or adjustable fixture. Other designs that are used for conventional shower fixtures may be used in other embodiments, wherein hardcoat anodized aluminum and/or other high thermal conductivity materials are used to create a thermal path from the solid state light emitting elements to outside the housing.

EXAMPLE

The following Example shall be regarded as merely illustrative and shall not be construed as limiting the invention.

In order to measure the thermal efficiency between hard anodized aluminum substrates and unpolished aluminum substrates, two fixtures were created with ten blue XLamp 7090 XR-E series LEDs mounted on 1"×12" strips. The strips are distributed by McMaster-Carr Supply Company (mcmaster.com). Part No. 6023K151 is a hardcoat anodized aluminum strip and Part No. 9134K111 is an unpolished, unanodized aluminum strip. These aluminum strips are also available from many other sources. Table 1 illustrates the temperature differentials between the LED housing and the back of the strip over time for the hardcoat anodized aluminum substrate, and Table 2 shows these temperature differentials for the unpolished aluminum sheet.

TABLE 1

Hardcoat 6023K151

| Time (minutes) | LED housing | Back of strip | Difference |
|---|---|---|---|
| :00 | 21.5° C. | 21.5° C. | 0.0° C. |
| :05 | 40.3° C. | 40.0° C. | 0.3° C. |
| :10 | 41.3° C. | 41.4° C. | 0.1° C. |
| :15 | 41.2° C. | 41.0° C. | 0.2° C. |
| :25 | 43.8° C. | 43.4° C. | 0.4° C. |
| :35 | 44.4° C. | 43.6° C. | 0.8° C. |

TABLE 2

Plain Aluminum Sheet 9134K111

| Time (minutes) | LED housing | Back of strip | Difference |
|---|---|---|---|
| :00 | 21.1° C. | 21.2° C. | .1° C. |
| :05 | 40.3° C. | 39.8° C. | .5° C. |
| :10 | 45.0° C. | 44.2° C. | .8° C. |
| :15 | 46.8° C. | 45.2° C. | 1.4° C. |
| :25 | 48.6° C. | 47.0° C. | 1.6° C. |
| :35 | 49.1° C. | 47.4° C. | 1.7° C. |

As shown in these Tables, a 0.8° C. difference was found in the hardcoat substrate after 35 minutes and a 1.7° C. difference was found in the plain aluminum sheet after 35 minutes. Calculating the thermal resistance, a thermal resistance of 0.84 C/W was calculated for the hardcoat substrate, whereas a thermal resistance of 1.7885 C/W was calculated between the LED housing and the back of the plain aluminum strip. Thus, the thermal resistance with the hardcoat was about 47% lower than the plain aluminum. Stated differently, the plain aluminum may have about 100% greater thermal resistance than the hardcoat anodized aluminum substrate. This is also supported by the fact that after 35 minutes, the temperate of the plain strip rose to 49.1° C., as shown in Table 2. This implies that the heat buildup from the LED housing on the plain aluminum may cause the system to cool less efficiently.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting apparatus comprising:
a substrate;
a plurality of solid state light emitting elements mounted on a face of the substrate;
a bar that extends orthogonal to the substrate and is configured to slidably contact an edge of the substrate such that the substrate is slidable along the bar; and
a housing having an inside and an outside, the housing including an elongated aperture in the housing that is configured to hold the bar in the aperture such that the bar extends from the inside of the housing to the outside of the housing.

2. A light emitting apparatus according to claim 1 wherein the bar is a hardcoat anodized aluminum bar.

3. A light emitting apparatus according to claim 1 wherein the substrate includes a tab adjacent the edge thereof that is configured to slidably contact the bar.

4. A light emitting apparatus according to claim 3 further comprising a locking element that is configured to lock the tab in place along the bar.

5. A light emitting apparatus according to claim 4 wherein the locking element comprises a setscrew that extends through the tab.

6. A light emitting apparatus according to claim 1 further comprising a second substrate between at least one of the plurality of solid state light emitting elements and the substrate.

7. A light emitting apparatus according to claim 6 wherein the second substrate comprises a metal core printed circuit board.

8. A light emitting apparatus according to claim 1 wherein the housing includes an opening that faces the solid state light emitting elements such that the solid state light emitting elements emit light through the opening when they are energized.

9. A light emitting apparatus according to claim 1 wherein the housing comprises hardcoat anodized aluminum and is configured to hold the substrate therein.

10. A light emitting apparatus according to claim 1 wherein the bar is configured to directly slidably contact the edge of the substrate to dissipate heat from the solid state light emitting elements, through the substrate and through the bar to the outside of the housing.

11. A light emitting apparatus comprising:
a substrate;
a plurality of solid state light emitting elements mounted on a face of the substrate;
a bar that extends orthogonal to the substrate and is configured to slidably contact an edge of the substrate such that the substrate is slidable along the bar; and
a housing including an elongated aperture in the housing that is configured to hold the bar in the aperture such that the bar extends along the housing away from the substrate.

12. A light emitting apparatus according to claim 11 wherein the bar is a hardcoat anodized aluminum bar.

13. A light emitting apparatus according to claim 11 wherein the housing includes an opening that faces the solid state light emitting elements such that the solid state light emitting elements emit light through the opening when they are energized.

14. A light emitting apparatus according to claim 11 wherein the substrate includes a tab adjacent the edge thereof that is configured to slidably contact the bar.

15. A light emitting apparatus according to claim 14 further comprising a locking element that is configured to lock the tab in place along the bar.

16. A light emitting apparatus according to claim 15 wherein the locking element comprises a setscrew that extends through the tab.

17. A light emitting apparatus according to claim 11 further comprising a second substrate between at least one of the plurality of solid state light emitting elements and the substrate.

18. A light emitting apparatus according to claim 17 wherein the second substrate comprises a metal core printed circuit board.

19. A light emitting apparatus according to claim 11 wherein the housing comprises hardcoat anodized aluminum and is configured to hold the substrate therein.

20. A light emitting apparatus according to claim 11, wherein the housing has an inside and an outside, and wherein the bar is configured to directly slidably contact the edge of the substrate to dissipate heat from the solid state light emitting elements, through the substrate and through the bar to the outside of the housing.

21. A light emitting apparatus comprising:
a disk-shaped substrate;
a plurality of solid state light emitting elements on a face of the disk-shaped substrate;
a cylindrical housing including a plurality of axially extending elongated apertures therein, the housing having an inside and an outside;
a plurality of heat conducting bars, wherein each heat conducting bar is in an aperture such that each heat conducting bar extends from the inside of the cylindrical housing to the outside of the cylindrical housing;
wherein the disk-shaped substrate is mounted coaxially in the cylindrical housing such that an edge of the disk-shaped substrate is adjacent the plurality of heat conducting bars to dissipate heat from the solid state light emitting elements, through the disk-shaped substrate and through the heat conducting bars to the outside of the housing.

22. A light emitting apparatus according to claim 21 wherein the disk-shaped substrate and the plurality of heat conducting bars comprise hardcoat anodized aluminum.

23. A light emitting apparatus according to claim 21 wherein the disk-shaped substrate and the plurality of heat conducting bars are of higher thermal conductivity than the cylindrical housing.

24. A light emitting apparatus according to claim 23 wherein the disk-shaped substrate includes a plurality of tabs adjacent the edge thereof, a respective tab being configured to slidably contact a respective heat conducting bar.

25. A light emitting apparatus according to claim 24 further comprising a plurality of locking elements, a respective one of which is configured to lock a respective tab in place along a respective heat conducting bar.

26. A light emitting apparatus according to claim 25 wherein the plurality of locking elements comprise a plurality of setscrews, a respective one of which extends through a respective tab.

27. A light emitting apparatus according to claim 21 wherein the plurality of heat conducting bars are configured to directly slidably contact the edge of the disk-shaped substrate to dissipate heat from the solid state light emitting elements, through the disk-shaped substrate and through the heat conducting bars to the outside of the housing.

28. A light emitting apparatus according to claim 27 wherein the solid state light emitting elements face an opening at an end of the cylindrical housing such that the solid state light emitting elements emit light directly towards the opening when they are energized.

29. A light emitting apparatus according to claim 21 further comprising a second substrate between at least one of the plurality of solid state light emitting elements and the disk-shaped substrate.

30. A light emitting apparatus according to claim 29 wherein the second substrate comprises a metal core printed circuit board.

31. A method of assembling a light emitting apparatus comprising:
mounting a disk-shaped substrate having a plurality of solid state light emitting elements on a face thereof coaxially in a cylindrical housing having an inside and an outside that includes a plurality of axially extending elongated apertures in the housing and a plurality of heat conducting bars, wherein each heat conducting bar is in an aperture, such that each heat conducting bar extends from the inside of the housing to the outside of the housing, and an edge of the disk-shaped substrate is adjacent the plurality of heat conducting bars to dissipate heat from the solid state light emitting elements, through the disk-shaped substrate and through the heat conducting bars to the outside of the housing.

32. A method according to claim 31 wherein mounting comprises slidably mounting the disk-shaped substrate, wherein the edge of the disk-shaped substrate directly slidably contacts the plurality of heat conducting bars to dissipate heat from the solid state light emitting elements, through the disk-shaped substrate and through the heat conducting bars to the outside of the housing.

33. A method according to claim 32 wherein slidably mounting is followed by:
- slidably adjusting a position of the disk-shaped substrate in the cylindrical housing to a desired position; and
- fixing the position of the disk-shaped substrate in the cylindrical housing at the desired position.

* * * * *